United States Patent
Makino

(10) Patent No.: US 9,743,528 B2
(45) Date of Patent: Aug. 22, 2017

(54) METHOD FOR MANUFACTURING WIRING BOARD

(71) Applicant: IBIDEN CO., LTD., Ogaki (JP)

(72) Inventor: Toshihide Makino, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 288 days.

(21) Appl. No.: 14/633,241

(22) Filed: Feb. 27, 2015

(65) Prior Publication Data

US 2015/0257276 A1 Sep. 10, 2015

(30) Foreign Application Priority Data

Mar. 5, 2014 (JP) ................................ 2014-042422

(51) Int. Cl.
*H05K 3/00* (2006.01)
*H05K 3/40* (2006.01)

(52) U.S. Cl.
CPC ........... *H05K 3/0052* (2013.01); *H05K 3/403* (2013.01); *H05K 3/0047* (2013.01); *H05K 2203/0228* (2013.01); *Y10T 29/49124* (2015.01)

(58) Field of Classification Search
CPC ........ Y10T 137/0318; Y10T 29/49124; H05K 3/0047; H05K 2203/0228
USPC ....................... 29/829, 426.1, 835
See application file for complete search history.

(56) References Cited

U.S. PATENT DOCUMENTS 5,609,447 A * 3/1997 Britzke .................. B23B 51/02
408/144
8,328,473 B2 * 12/2012 Ito ........................... B23B 51/02
408/144

FOREIGN PATENT DOCUMENTS

JP 2009-188154 A 8/2009

* cited by examiner

*Primary Examiner* — Thiem Phan
(74) *Attorney, Agent, or Firm* — Oblon, McClelland, Maier & Neustadt, L.L.P.

(57) ABSTRACT

A method for manufacturing a wiring board includes preparing a large-sized wiring board having an effective region and a dummy region such that the board has a penetrating hole on a border of the effective and dummy regions and an inner-hole conductive layer covering an inner surface of the penetrating hole, moving a rotary tool having a tip blade along rotation axis at a peripheral portion of the penetrating hole such that the rotary tool drills a hole into the board at the peripheral portion and segments the conductive layer into portions in the effective and dummy regions, and moving a rotary tool having a side blade in a direction perpendicular to rotation axis such that the dummy region is cut off from the effective region after the rotary tool having tip blade makes the hole and a wiring board having the effective region of the board is formed.

19 Claims, 10 Drawing Sheets

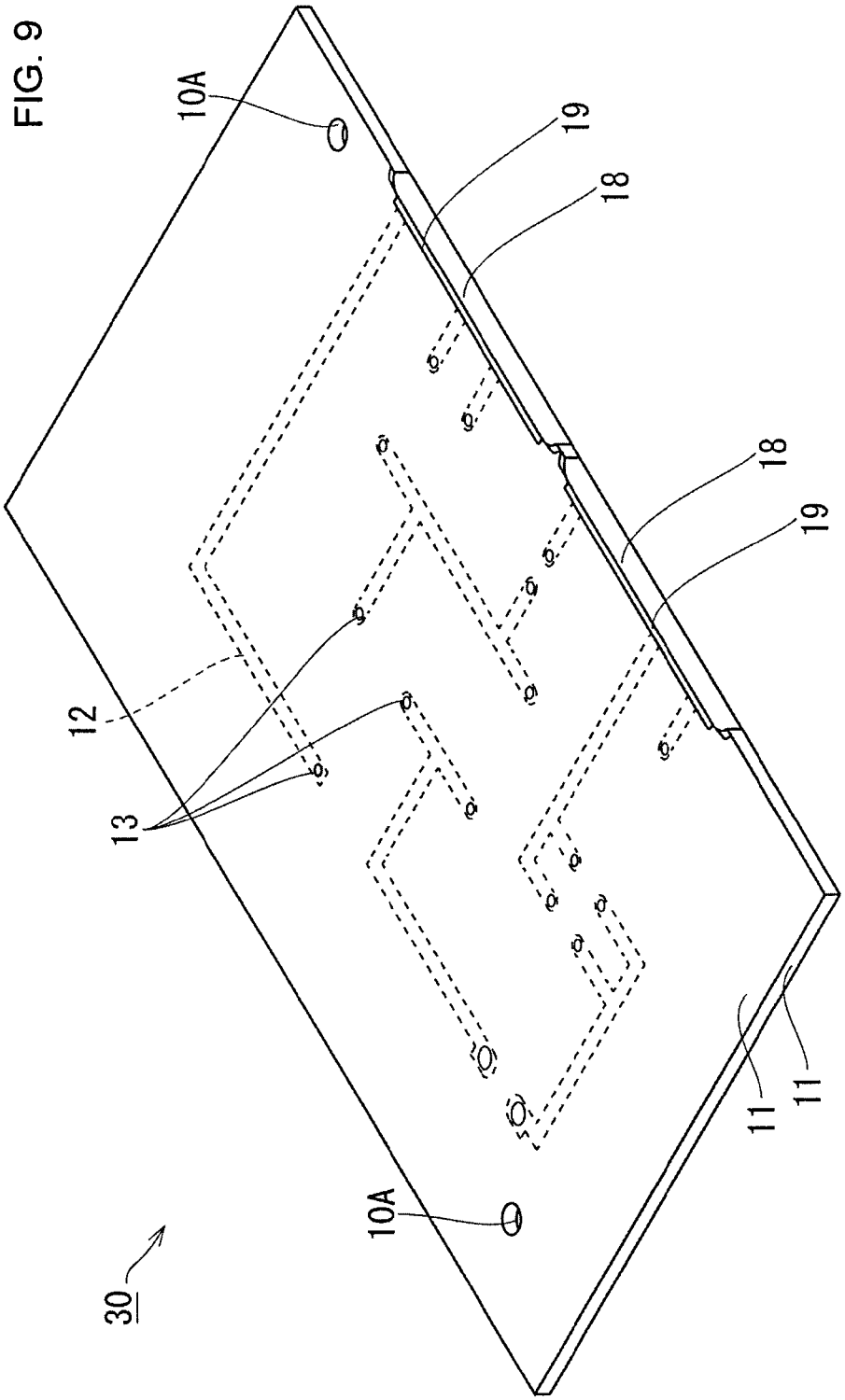

METHOD FOR MANUFACTURING WIRING BOARD

CROSS-REFERENCE TO RELATED APPLICATIONS

The present application is based upon and claims the benefit of priority to Japanese Patent Application No. 2014-042422, filed Mar. 5, 2014, the entire contents of which are incorporated herein by reference.

BACKGROUND OF THE INVENTION

Field of the Invention

The present invention relates to a method for manufacturing a wiring board by preparing a large-size wiring board where a penetrating hole is formed on the border of an effective region and a dummy region, and the inner surface of the penetrating hole is coated with an inner-hole conductive layer. When the dummy region is cut off from the large-size wiring board, a wiring board is obtained.

Description of Background Art

In a method for manufacturing a wiring board, a rotary tool with a cutting blade provided on a side surface of the shaft may be set to move in a direction perpendicular to the rotation axis and cut off a dummy region from a large-size wiring board (see JP2009-188154A). The entire contents of this publication are incorporated herein by reference.

SUMMARY OF THE INVENTION

According to one aspect of the present invention, a method for manufacturing a wiring board includes preparing a large-sized wiring board having an effective region and a dummy region such that the large-sized wiring board has a penetrating hole on a border of the effective region and the dummy region and an inner-hole conductive layer covering an inner surface of the penetrating hole, moving a rotary tool having a tip blade along a rotation axis of the rotary tool at a peripheral portion of the penetrating hole such that the rotary tool drills a hole into the large-sized wiring board at the peripheral portion of the penetrating hole and segments the inner-hole conductive layer into a portion in the effective region and a portion in the dummy region, and moving a rotary tool having a side blade in a direction perpendicular to a rotation axis of the rotary tool having the side blade such that the dummy region is cut off from the effective region after the rotary tool having the tip blade makes the hole in the large-sized wiring board at the peripheral portion of the penetrating hole and a wiring board having the effective region of the large-sized wiring board is formed. The rotary tool having the tip blade has a shaft and a drill blade at a tip of the shaft, and the rotary tool having the side blade has a shaft and a cutting blade on a side surface of the shaft.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 9 is a perspective view of a wiring board; and

DETAILED DESCRIPTION OF THE EMBODIMENTS

Figure 1:
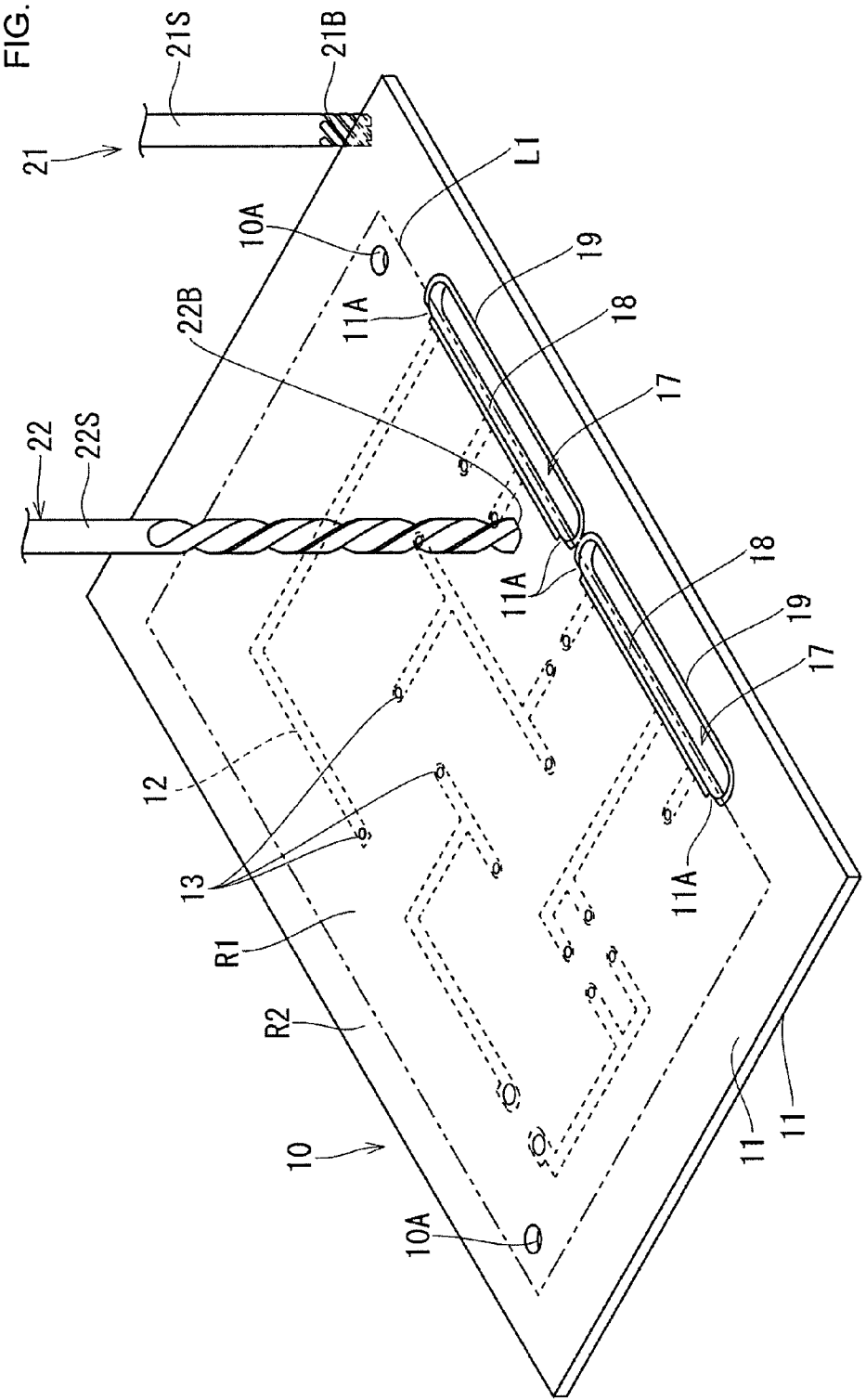
FIG. 1 is a perspective view of a large-size wiring board according to an embodiment of the present invention.

The embodiments will now be described with reference to the accompanying drawings, wherein like reference numerals designate corresponding or identical elements throughout the various drawings.

In the following, an embodiment of the present invention is described with reference to FIG. 1~9. In a method for manufacturing wiring board 30 according to the present embodiment, large-size wiring board 10 shown in FIG. 1 is cut off to obtain wiring board 30 shown in FIG. 9. In large-size wiring board 10, rectangular effective region (R1) and dummy region (R2) surrounding the effective region are formed, for example. Electrical circuits 12 are printed on effective region (R1). In addition, the upper and lower surfaces of large-size wiring board 10 are covered with solder-resist layers (11, 11) (corresponding to "outer insulation layer" in the embodiments of the present invention), and portions of electrical circuits 12 are exposed through openings formed in solder-resist layers (11, 11) to make a group of pads 13. Moreover, in effective region (R1), multiple alignment holes (10A) penetrating through the wiring board are formed to fix and align large-size wiring board 10 by using a later-described jig (not shown). In FIG. 1, a two-dot chain line indicates virtual border line (L1) that divides effective region (R1) and dummy region (R2).

In large-size wiring board 10, a pair of long holes (17, 17), which correspond to "penetrating holes" in the embodiments of the present invention, are formed on border line (L1) between one of the peripheral sides of effective region (R1) and dummy region (R2). Long holes (17, 17) extend along border line (L1). Border line (L1) is positioned on the effective region (R1) side of long holes (17, 17) in a lateral direction. The inner-side surface of each long hole 17 is covered with inner-hole conductive layer 18, and the opening edges of each long hole 17 on the upper and lower surfaces of large-size wiring board 10 are respectively covered with opening-edge conductive layers (19, 19), which extend sideways from inner-hole conductive layer 18. A pair of through holes is made up of a pair of long holes (17, 17), inner-hole conductive layers 18 and opening-edge conductive layers 19. Part of electrical circuit 12 is electrically connected to inner-hole conductive layer 18 in those through holes. The distance in a lateral direction between inner-hole conductive layers (18, 18) in long hole 17 is 1.0 mm, for example.

Figure 3:
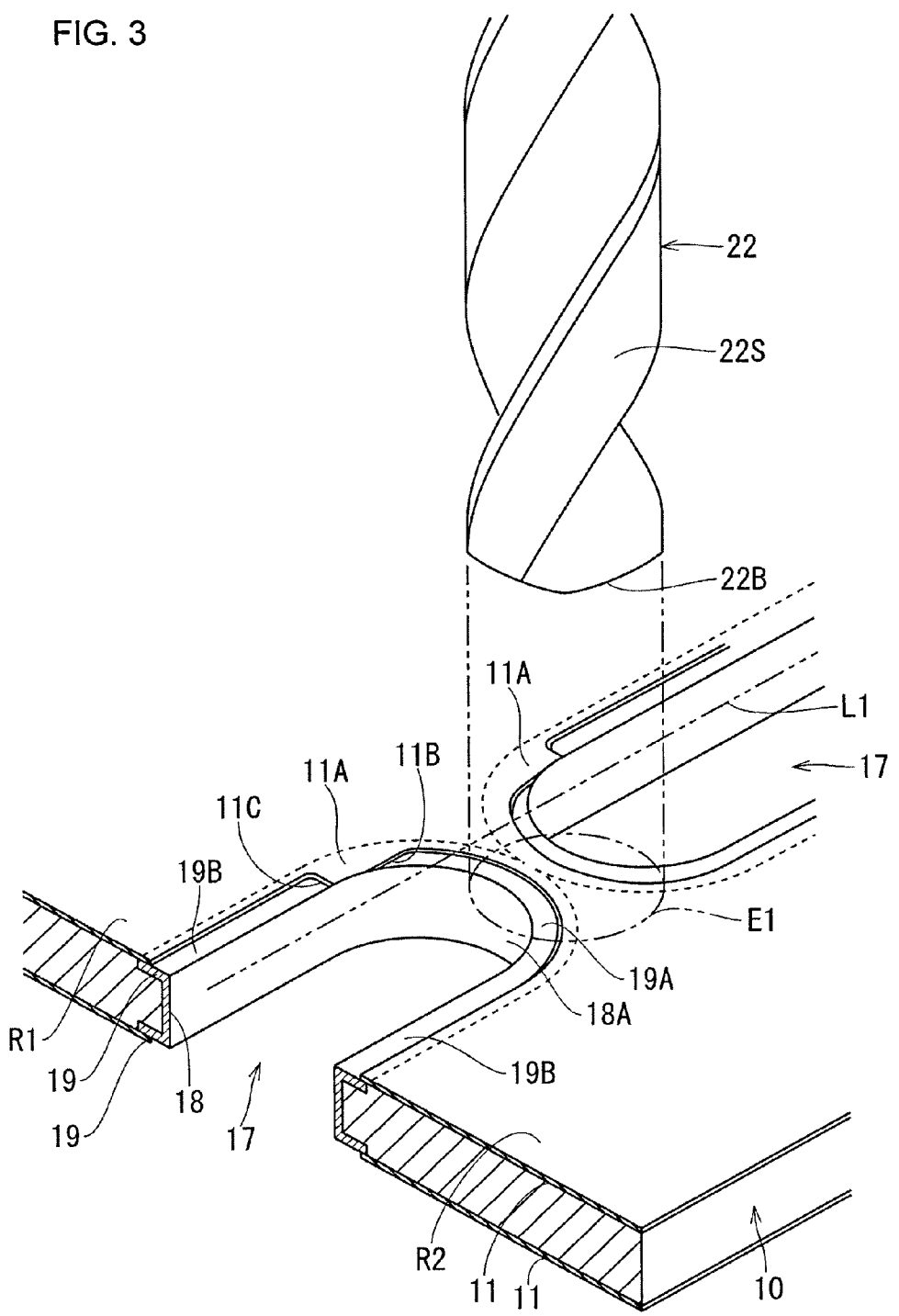
FIG. 3 is a perspective breakaway view showing part of a large-size wiring board.

As shown in FIG. 3, the tip of the entire periphery of opening-edge conductive layer 19 on the side away from inner-hole conductive layer 18 is covered with solder-resist layer 11. Part of arc portion (19A) of opening-edge conductive layer 19 positioned on each of both ends of long hole 17 in a longitudinal direction is covered with solder-resist layer 11 from tip to base. More specifically, corner cover portion (11A) of solder-resist layer 11, which covers opening-edge conductive layer 19 from tip to base, is positioned on the effective region (R1) side in arc portion (19A) of opening-edge conductive layer 19 and is made up of first periphery (11B) extending parallel to straight portion (19B) of opening-edge conductive layer 19 on the effective region (R1) side of arc portion (19A) and of second periphery (11C) extending perpendicular to first periphery (11B) at the border of straight portion (19B) and arc portion (19A) of opening-edge conductive layer 19.

Figure 4:
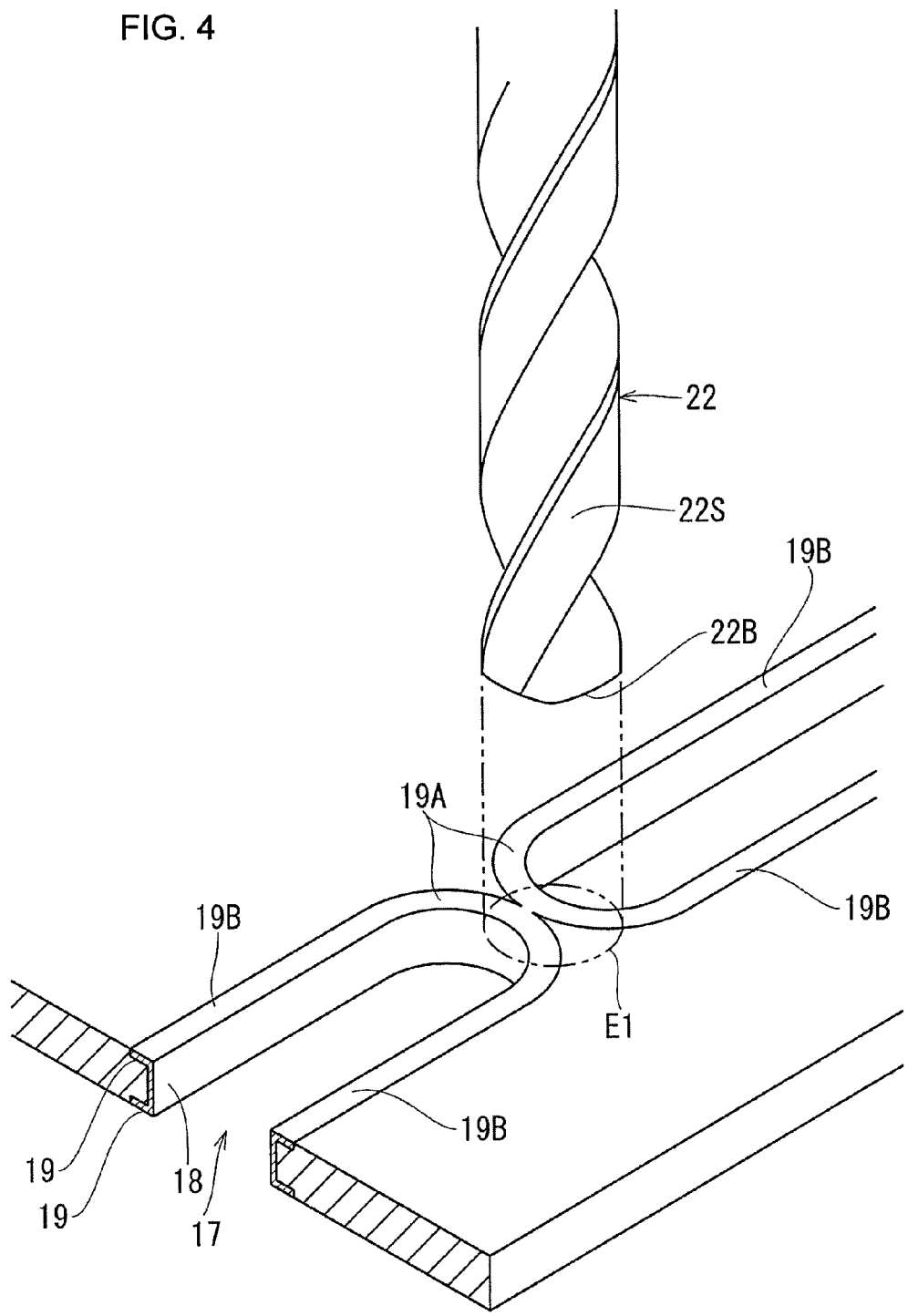
FIG. 4 is a perspective breakaway view showing part of a large-size wiring board with solder-resist layers omitted.

In large-size wiring board 10 of the present embodiment, adjacent ends of long holes (17, 17) face each other, and the tip ends of opening-edge conductive layers (19, 19) of long holes (17, 17) are joined, for example, at the center of long holes (17, 17) in a width direction as shown in FIG. 4. In addition, the joined portion of opening-edge conductive layers (19, 19) is covered with solder-resist layer 11 as shown in FIG. 3.

To manufacture wiring board 30, above-described large-size wiring board 10 is fixed to a jig of a numerical control (NC) machine (not shown), and processed by first rotary rough-cutting tool 21, first rotary finishing tool 23, and second rotary tool 22 to be attached to the rotary drive shaft of the NC machine. The jig includes alignment pins to be inserted into alignment holes (10A) of large-size wiring board 10, and is structured to hold only effective region (R1) of large-size wiring board 10. In addition, first rotary tools (21, 23) for rough cutting and finishing have cutting blades (21B, 23B) respectively on side surfaces of shafts (21S, 23S), and cut large-size wiring board 10 by moving in a direction perpendicular to the rotation axis (center axes of shafts (21S, 23S)). On the other hand, second rotary tool 22 is structured to have a drilling blade (22B) at the tip of shaft (22S) and drills holes in large-size wiring board 10 by moving along the rotation axis (the direction parallel to the center axis of shaft (22S)).

The outer diameter of first rotary rough-cutting tool 21 and second rotary tool 22 is set at 1.2 mm, for example. In addition, for example, first rotary finishing tool 23 is set to have a smaller diameter than first rotary rough-cutting tool 21.

Figure 2:
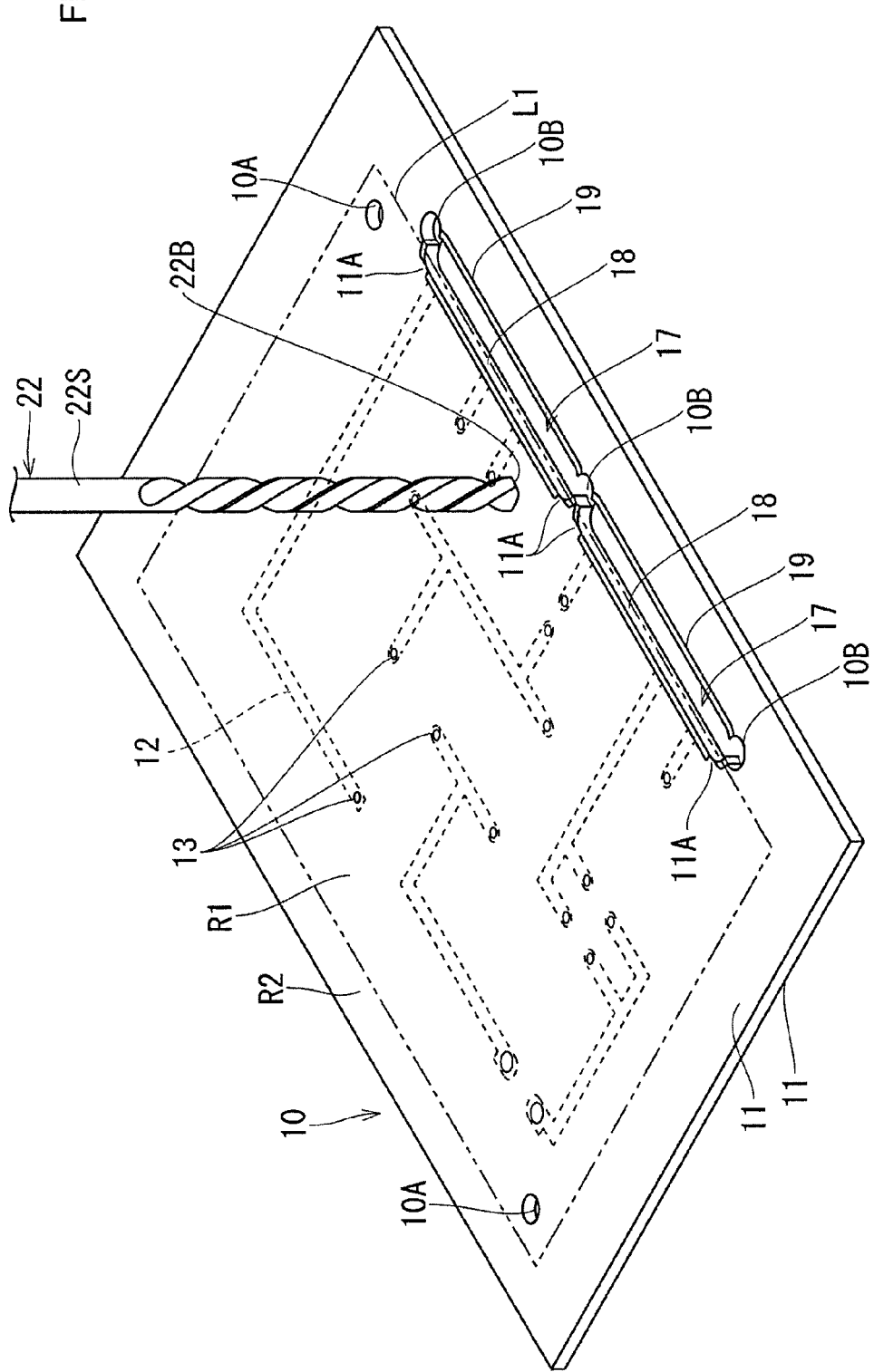
FIG. 2 is a perspective view showing segmented holes drilled into the large-size wiring board.

In the method for manufacturing wiring board 30 of the present embodiment, first, three portions in large-size wiring board 10, one at the adjacent ends of long holes (17, 17) and two at the other opposing ends of long holes (17, 17), are drilled as shown in FIG. 2 by second rotary tool 22 to form segmented holes (10B) so that inner-hole conductive layers 18 and opening-edge conductive layers 19 are segmented. More specifically, as shown in FIG. 3, the rotation center of second rotary tool 22 is positioned on the dummy region (R2) side of border line (L1), while the portion where the outline of projected circle (E1) of second rotary tool 22 on large-size wiring board 10 intersects with arc portions (18A, 19A) of inner-hole conductive layer 18 and opening-edge conductive layer 19 is positioned slightly (for example, 150 μm) on the dummy region (R2) side of border line (L1). Also, in the adjacent ends of both long holes (17, 17), the rotation center of second rotary tool 22 is positioned on the center line between long holes (17, 17).

Figure 5:
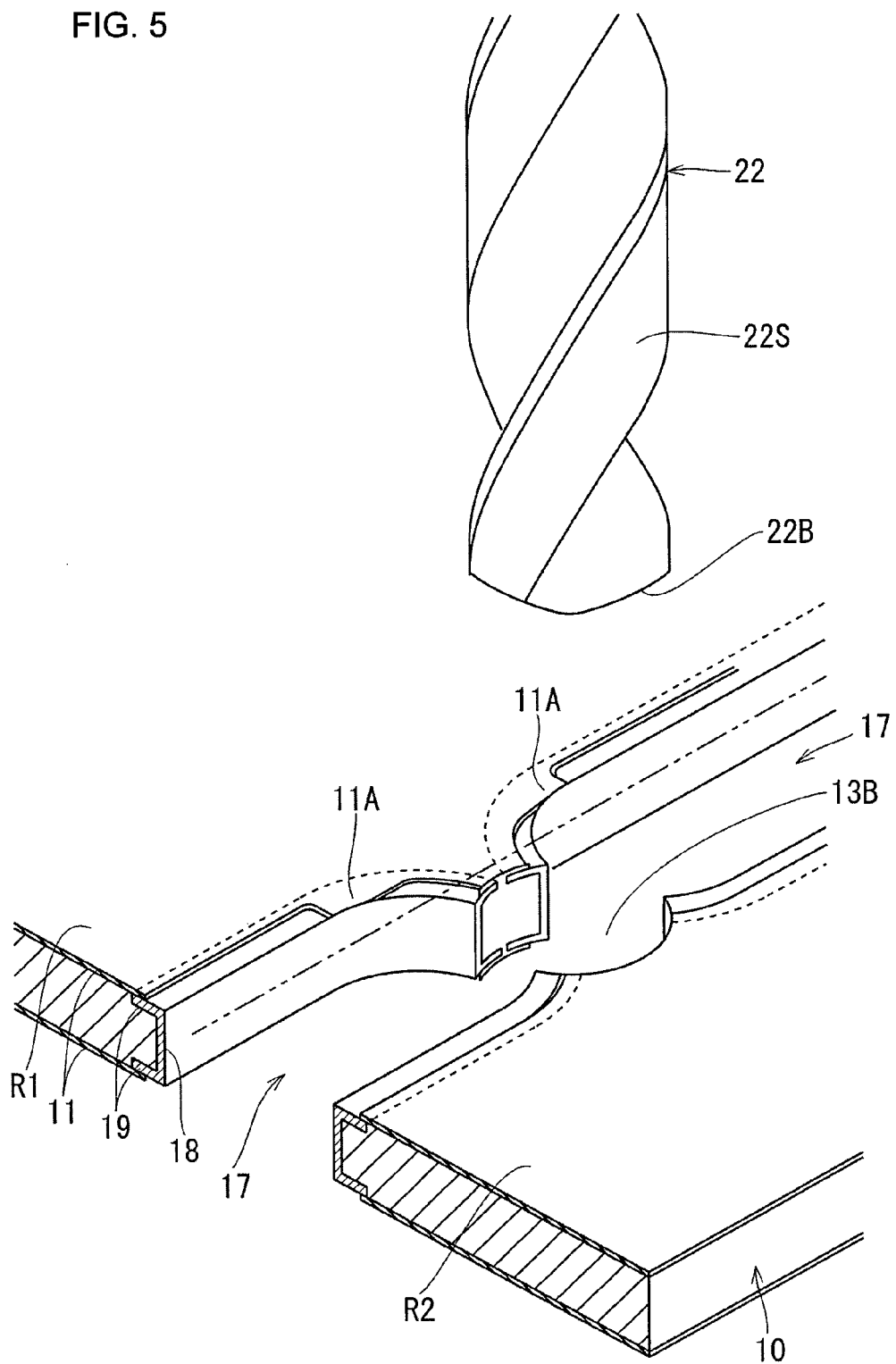
FIG. 5 is a perspective view of a segmented hole drilled into a large-size wiring board.

Next, second rotary tool 22 moves along the rotation axis at each of three portions so that segmented holes (10B) are drilled in large-size wiring board 10 as shown in FIG. 5. Here, when second rotary tool 22 cuts through inner-hole conductive layer 18, the contact area of second rotary tool 22 and inner-hole conductive layer 18 is smaller than the contact area that first rotary tools (21, 23) make with inner-hole conductive layer 18 when first rotary tools (21, 23) cut inner-hole conductive layer 18 by moving in a direction perpendicular to their rotation axes. As a result, peeling of inner-hole conductive layer 18 is suppressed when inner-hole conductive layer 18 is segmented. Moreover, since inner-hole conductive layer 18 is integrated with opening-edge conductive layer 19, which is fixed by corner cover portion (11A) of solder-resist layer 11, peeling of inner-hole conductive layer 18 is further suppressed.

Figure 6:
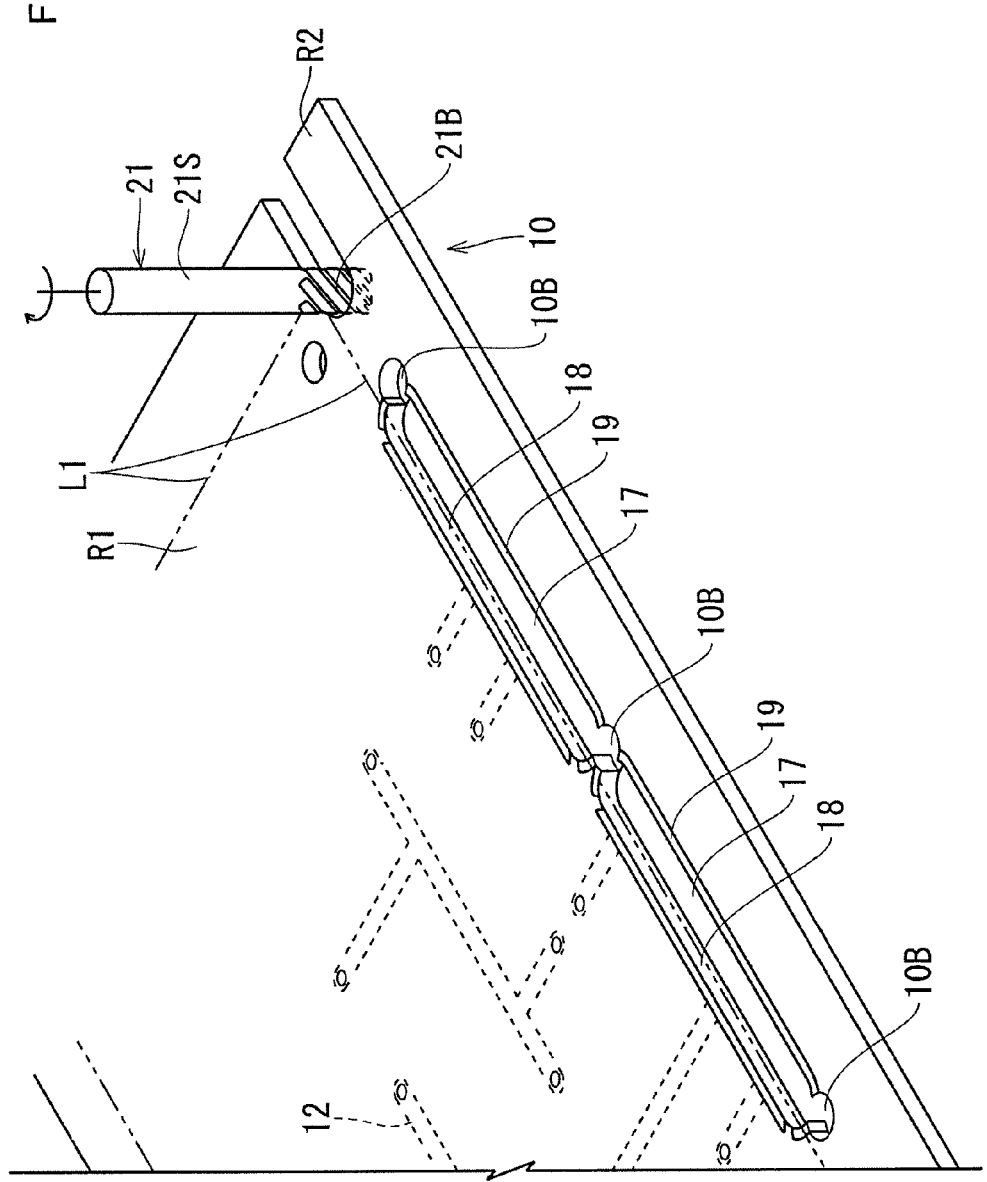
FIG. 6 is a perspective view showing a first rotary tool cutting into a large-size wiring board.

Next, as shown in FIG. 6, dummy region (R2) of large-size wiring board 10 is cut by first rotary rough-cutting tool 21. During that time, first rotary rough-cutting tool 21 moves relative to large-size wiring board 10 in such a way that cut surfaces to be formed by first rotary rough-cutting tool 21 are positioned slightly (for example, 200 μm) outside border line (L1) along four sides of effective region (R1) in large-size wiring board 10. In addition, regarding dummy region (R2) that includes long holes (17, 17), first rotary rough-cutting tool 21 moves from one end of border line (L1) toward the other while cutting remaining arc-shaped portions left behind by second rotary tool 22 so as to make them into flat surfaces. During that time, when the cutting blade of first rotary tool 21 makes contact with an edge of a segmented portion of inner-hole conductive layer 18 formed by second rotary tool 22, the segmented portion is cut with the cutting blade at the contact portion if the portion is easy for the blade to cut, but if the portion is hard to cut, it escapes the blade. That minimizes such situations where inner-hole conductive layer 18 is pulled by the cutting blade of first rotary rough-cutting tool 21 and thereby peeled from the inner surface of long hole 17.

Next, by cutting with first rotary finishing tool 23, a finishing process is conducted on the portions of large-size wiring board 10 left behind by first rotary rough-cutting tool 21 as shown in FIG. 7. During that time, regarding effective region (R1) that includes first and second long holes (17, 17), the moving direction and rotation direction of first rotary finishing tool 23 are switched so that first rotary finishing tool 23 moves from the inner side of a long hole 17 toward a segmented portion of the long hole 17, while first rotary tool 23 rotates in such a way that the front portion of first rotary tool 23 in the direction of travel moves from the effective region (R1) side toward the dummy region (R2) side. In the following, right-side long hole 17 in FIG. 7 is referred to as "first long hole (17X)" and left-side long hole 17 as "second long hole (17Y)" to describe in detail the finishing process by first rotary finishing tool 23.

Figure 7A:
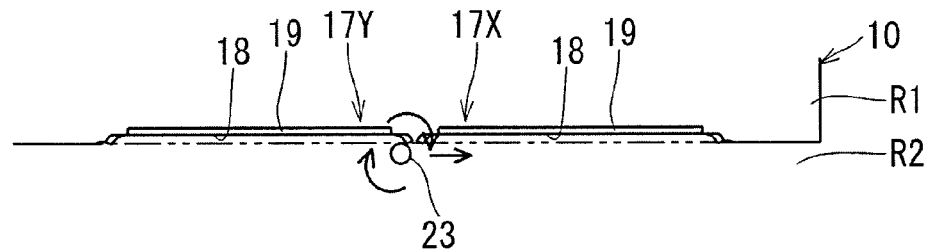
FIG. 7(A)-7(D) are plan views showing a first rotary tool performing a finishing process on a large-size wiring board.

Regarding effective region (R1) that includes first and second long holes (17, 17), first rotary finishing tool 23 rotates clockwise as shown in FIG. 7(A), and is inserted into second long hole (17Y) while avoiding contact with large-size wiring board 10. Then, first rotary tool 23 moves along border line (L1) toward first long hole (17X) to perform the finishing process on the segmented portion of second long hole (17Y) on the first long hole (17X) side. Then, before first rotary tool 23 reaches the segmented portion of first long hole (17X), first rotary tool 23 is pulled away from large-size wiring board 10.

Figure 7B:
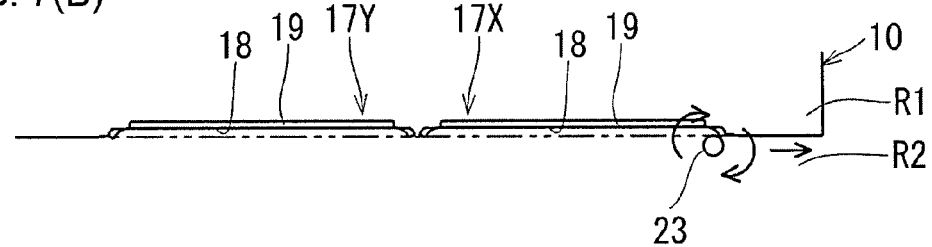

Next, first rotary tool 23 is inserted into first long hole (17X) while avoiding contact with large-size wiring board 10, and moves along border line (L1) as shown in FIG. 7(B) in a direction away from second long hole (17Y) to perform a finishing process on the segmented portion of first long hole (17X) opposite the second long hole (17Y) side and on the entire portion in front of the segmented portion.

Figure 7C:
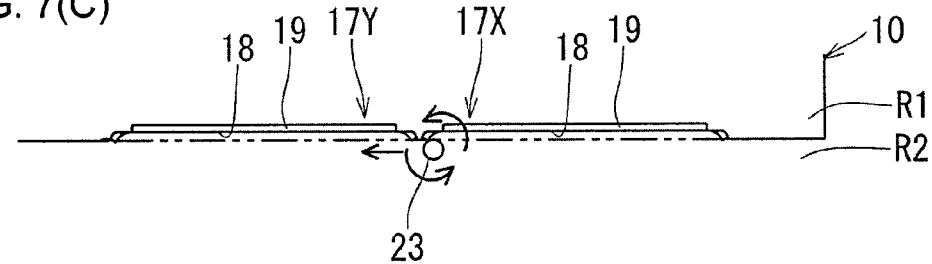

Next, first rotary tool 23 rotates counterclockwise as shown in FIG. 7(C), and is inserted into first long hole (17X) while avoiding contact with large-size wiring board 10. Then, first rotary tool 23 moves along border line (L1) toward second long hole (17Y) to perform a finishing process on the segmented portion of first long hole (17X) on the second long hole (17Y) side. Before first rotary tool 23 reaches the segmented portion of second long hole (17Y), first rotary tool 23 is pulled away from large-size wiring board 10.

Figure 7D:
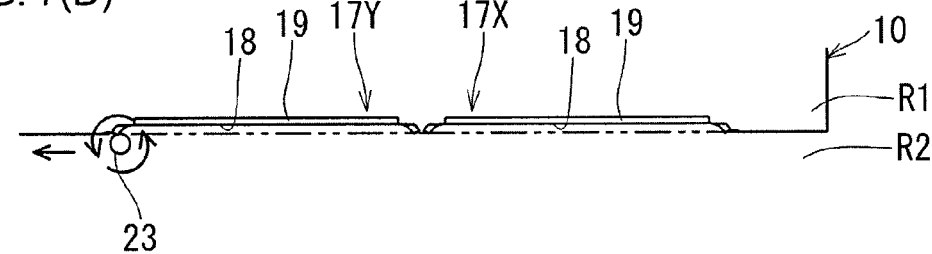
Figure 8:
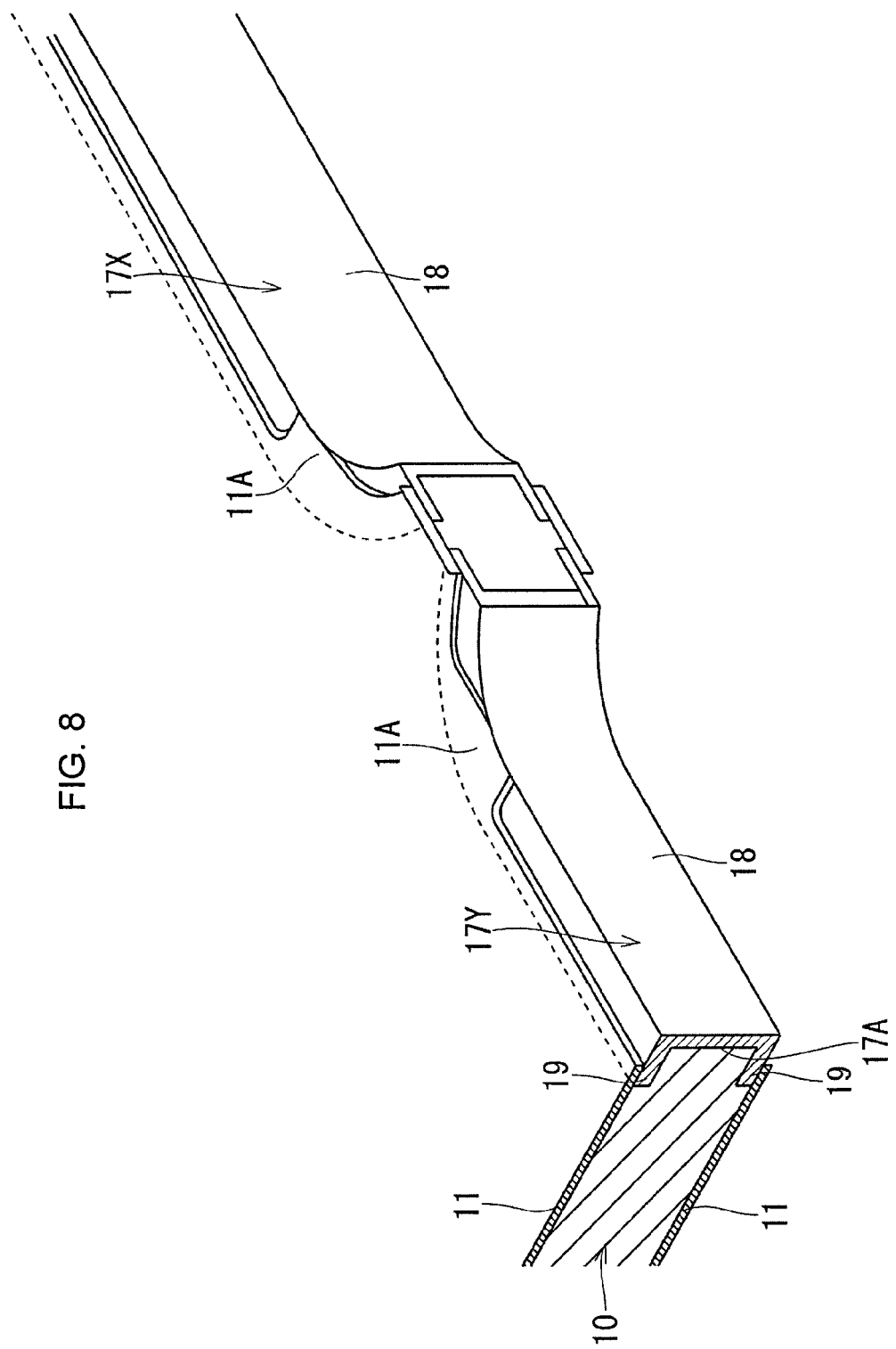
FIG. 8 is a perspective view showing a portion of a wiring board cut by a first rotary tool.

Next, first rotary tool 23 is inserted into second long hole (17Y) while avoiding contact with large-size wiring board 10, and moves along border line (L1) in a direction away from first long hole (17X) as shown in FIG. 7(D) to perform a finishing process on the segmented portion of second long hole (17Y) opposite the first long hole (17X) side and on the entire portion in front of the segmented portion.

In the present embodiment, for processing all the segmented portions of long holes 17, first rotary finishing tool 23 moves from the inner side of long hole 17 toward each of the segmented portions of long hole 17 to perform a finishing process while first rotary finishing tool 23 rotates in such a way that the front portion of first rotary finishing tool 23 in the direction of travel moves from the effective region (R1) side toward the dummy region (R2) side as described above. Accordingly, cutting blade (23B) on the side surface of first rotary finishing tool 23 causes the segmented portion of inner-hole conductive layer 18 to be pressed against the inner surface of long hole 17 during the cutting process, thereby preventing inner-hole conductive layer 18 from being peeled. When the finishing process of the periphery along border line (L1) in large-size wiring board 10 is completed, wiring board 30 is obtained.

As described above, in the method for manufacturing wiring board 30 of the present embodiment, when inner-hole conductive layer 18 in long hole 17 of large-size wiring board 10 is segmented into effective region (R1) and dummy region (R2) of large-size wiring board 10, drilling blade (22B) at the tip of second rotary tool 22 is used. Thus, compared with conventional methods, the segmented portion of inner-hole conductive layer 18 is less likely to be peeled by the tool, and inner-hole conductive layer 18 is suppressed from being removed from the inner surface of long hole 17. In addition, since opening-edge conductive layer 19, which envelops the opening periphery of long hole 17, is covered by solder-resist layer 11 of large-sized wiring board 10, inner-hole conductive layer 18 is further prevented from peeling because it is integrated with opening-edge conductive layer 19. Accordingly, defective products caused by peeled inner-hole conductive layer 18 decrease, and the productivity of wiring boards is thereby enhanced. In addition, when second rotary tool 22 drills segmented holes (10B), the tool connects adjacent long holes (17, 17). Therefore, after the process by second rotary tool 22, the procedures to be taken decrease when dummy region (R2) is cut to be removed by first rotary tool 21. Moreover, when second rotary tool 22 drills segmented holes (10B), since the rotation center of second rotary tool 22 is positioned on the dummy region (R2) side of border line (L1), the portion of segmented hole (10B) cut into the effective portion (R1) side is reduced, and it is easier to level out the periphery of effective region (R1).

OTHER EMBODIMENTS

The present invention is not limited to the above embodiment, and the embodiments described below, for example, are included in the technological scope of the present invention. Also, various modifications other than those below are also possible within a scope that does not deviate from the gist of the present invention.

(1) In the embodiment above, after the drilling by second rotary tool 22, a finishing process is conducted by using two first rotary tools (21, 23) for rough cutting and finishing respectively. However, such a process may be conducted by using one first rotary tool.

(2) In the embodiment above, first rotary tool 23 moves from the inner side of long hole 17 toward its segmented portion when a finishing process is conducted on the segmented portion. However, the first rotary tool may also move from the outer side of long hole 17 toward its segmented portion. In such a case, the first rotary tool rotates in such a way that the front portion of the first rotary tool in the direction of travel moves from the dummy region (R2) side toward the effective region (R1) side. By so setting, the segmented portion of inner-hole conductive layer 18 is pressed against the inner surface of long hole 17 during the cutting process, and peeling of inner-hole conductive layer 18 is thereby prevented.

Figure 10A:
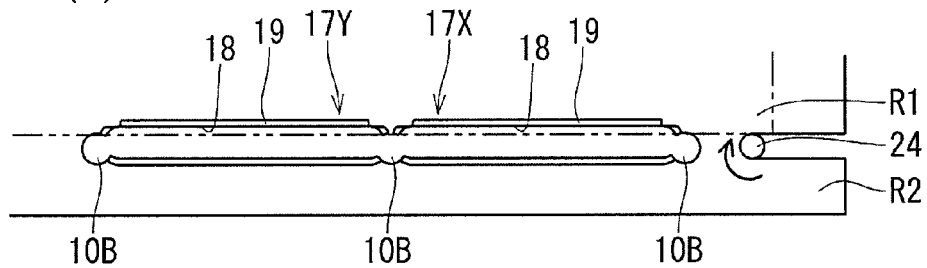
FIG. 10(A)-10(D) are plan views showing a large-size wiring board according to another embodiment, where a first rotary tool is cutting and performing a finishing process.
Figure 10B:
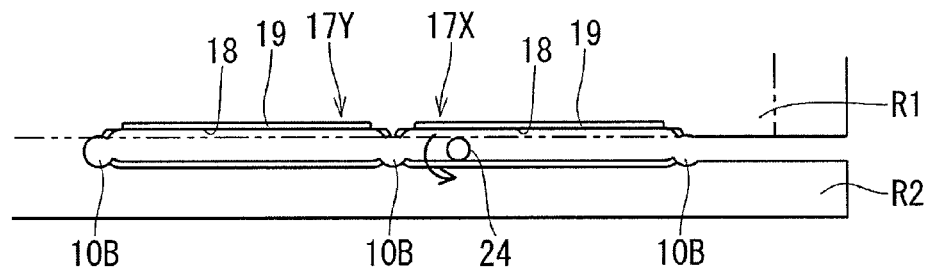
Figure 10C:
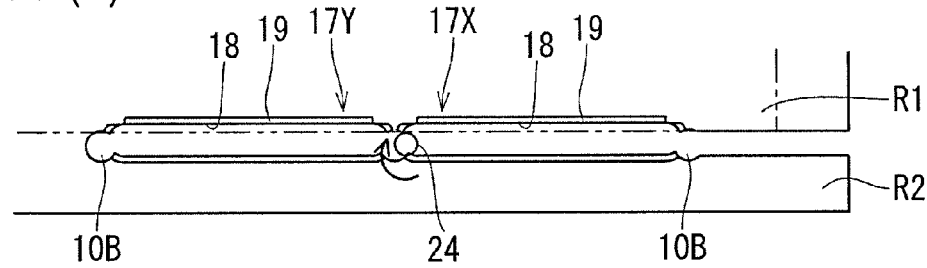
Figure 10D:
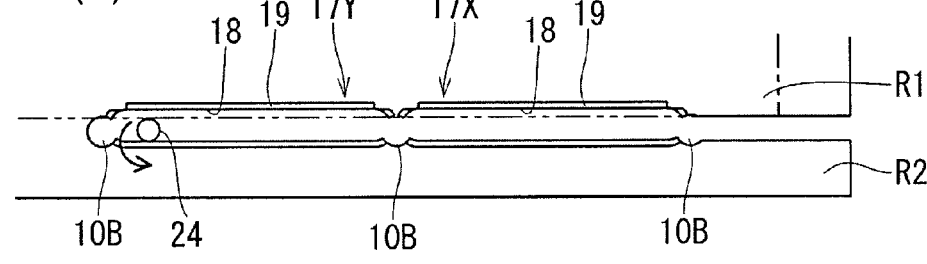

(3) Furthermore, as shown in FIG. 10(A)~10(D), after segmented holes (10B) are drilled by second rotary tool 22, first rotary tool 24 may move from one end to the other end of border line (L1) where long holes (17X, 17Y) are present so that a finishing process performed by moving first rotary tool 24 from the outer side of long holes (17X, 17Y) toward a segmented portion is alternated with another finishing process performed by moving first rotary tool 24 from the inner side toward a segmented portion. More specifically, as shown in FIG. 10(A), first rotary tool 24 moves toward first long hole (17X) from one peripheral side of large-size wiring board 10 on an extension line of border line (L1) where long holes (17X, 17Y) are located. At that time, first rotary tool 24 rotates clockwise as shown in FIG. 10(A). Next, first rotary tool 24 moves from the outer side of first long hole (17X) toward a segmented portion on one end of first long hole (17X) to perform the finishing process. Then, when first rotary tool 24 enters first long hole (17X), the rotation direction of first rotary tool 24 is inverted to counterclockwise as shown in FIG. 10(B) so that first rotary tool 24 moves from the inner side of first hole (17X) toward a segmented portion on the other end of first long hole (17X). When first rotary tool 24 completes the finishing process on the segmented portion on the other end of first long hole (17X), before it reaches a segmented portion on one end of second long hole (17Y), the rotation direction of first rotary tool 24 is inverted to clockwise, as shown in FIG. 10(C). Then, first rotary tool 24 moves toward a segmented portion on the other end of second long hole (17Y). When first rotary tool 24 completes the finishing process on the segmented portion on one end of second long hole (17Y) and enters second long hole (17Y), the rotation direction of first rotary tool 24 is inverted to counterclockwise as shown in FIG. 10(D). Then, first rotary tool 24 moves toward a segmented portion on the other end of second long hole (17Y), and conducts the finishing process on the segmented portion. As described above, when first rotary tool 24 moves from the inner side of long holes (17X, 17Y) toward a segmented portion, first rotary tool 24 rotates in such a way that the front portion of first rotary tool 24 in the direction of travel moves from the effective region (R1) side toward the dummy region (R2) side. By contrast, when first rotary tool 24 moves from the outer side of long holes (17X, 17Y) toward a segmented portion, the front portion of first rotary tool 24 in the direction of travel moves from the dummy region (R2) side toward the effective region (R1) side. As a result, on any end portion of long holes (17X, 17Y), inner-hole conductive layer 18 in segmented portions is cut while being pressed against the inner surface of long hole 17 by first rotary tool 24, and peeling of inner-hole conductive layer 18 is thereby prevented.

(2) In the above embodiment, after inner-hole conductive layer 18 is segmented by second rotary tool 22, the entire dummy region (R2) is removed. However, it is an option for inner-hole conductive layer 18 to be segmented by second rotary tool 22 after part of dummy region (R2) that does not include long hole 17 is removed by first rotary tool 21, and then for the remaining dummy region (R2) to be removed by first rotary tool 21.

(3) A "penetrating hole" formed in large-size wiring board 10 indicates long hole 17 in the embodiment above. However, a penetrating hole may be formed to be circular or rectangular.

(4) In the embodiment above, after the drilled portions are formed by second rotary tool 22, additional procedures by first rotary tools (21, 23) are conducted to make the cut surfaces flat. However, it is also an option not to perform an additional process on drilled portions.

In a method for manufacturing a wiring board described in JP2009-188154A, the inner-hole conductive layer of the penetrating hole may be peeled by the rotary tool and removed from the inner surface of the penetrating hole, resulting in a defective wiring board.

A method for manufacturing wiring boards according to an embodiment of the present invention achieves higher productivity.

In a method for manufacturing a wiring board according to an embodiment of the present invention, a large-size wiring board is prepared to have a penetrating hole on the border of an effective region, which is subsequently used as a wiring board, and a dummy region positioned in the rest of the large-size wiring board; the inner surface of the penetrating hole is covered with an inner-hole conductive layer; and the dummy region is cut off by moving a first rotary tool having a cutting blade provided on a side surface of the shaft in a direction perpendicular to the rotation axis. In such a method, prior to cutting the dummy region that includes part of the penetrating hole by using the first rotary tool, a hole is drilled in the opening periphery of the penetrating hole by moving a second rotary tool having a drilling blade at the tip of the shaft along the rotation axis so that the inner-hole conductive layer is segmented into the effective region and the dummy region.

Obviously, numerous modifications and variations of the present invention are possible in light of the above teachings. It is therefore to be understood that within the scope of the appended claims, the invention may be practiced otherwise than as specifically described herein.

What is claimed is:

1. A method for manufacturing a wiring board, comprising:
preparing a large-sized wiring board having an effective region and a dummy region such that the large-sized wiring board has a penetrating hole on a border of the effective region and the dummy region and an inner-hole conductive layer covering an inner surface of the penetrating hole;
moving a rotary tool having a tip blade along a rotation axis of the rotary tool at a peripheral portion of the penetrating hole such that the rotary tool drills a hole into the large-sized wiring board at the peripheral portion of the penetrating hole and segments the inner-hole conductive layer into a portion in the effective region and a portion in the dummy region; and
moving a rotary tool having a side blade in a direction perpendicular to a rotation axis of the rotary tool having the side blade such that the dummy region is cut off from the effective region after the rotary tool having the tip blade makes the hole in the large-sized wiring board at the peripheral portion of the penetrating hole and a wiring board comprising the effective region of the large-sized wiring board is formed,
wherein the rotary tool having the tip blade has a shaft and a drill blade at a tip of the shaft, and the rotary tool having the side blade has a shaft and a cutting blade on a side surface of the shaft.

2. The method for manufacturing a wiring board according to claim 1, wherein the large-sized wiring board has a second penetrating hole formed side by side with the penetrating hole such that the second penetrating hole is on the border of the effective region and the dummy region, the large-sized wiring board has a second inner-hole conductive layer covering an inner surface of the second penetrating hole, and the moving of the rotary tool having the tip blade comprises forming the hole connecting the penetrating hole and the second penetrating hole.

3. The method for manufacturing a wiring board according to claim 2, wherein the moving of the rotary tool having the tip blade includes positioning the rotary tool having the tip blade such that a center of the rotary tool having the tip blade is on a dummy region side of the border of the effective region and the dummy region.

4. The method for manufacturing a wiring board according to claim 2, wherein the large-sized wiring board has an opening-edge conductive layer and an outer insulating layer such that the opening-edge conductive layer is extending sideway from the inner-hole conductive layer and covering an opening edge portion of the large-sized wiring board and that the outer insulating layer is covering an electrical circuit printed in the effective region of the large-sized wiring board and a tip portion of the opening-edge conductive layer on the large-sized wiring board.

5. The method for manufacturing a wiring board according to claim 2, wherein the penetrating hole is formed such that the penetrating hole is a long hole elongated along the border, and the large-sized wiring board has an opening-edge conductive layer and an outer insulating layer such that the opening-edge conductive layer is extending sideway from the inner-hole conductive layer and covering an opening edge portion of the large-sized wiring board and that the outer insulating layer is covering an electrical circuit printed in the effective region of the large-sized wiring board and from a tip portion to a base portion of the opening-edge conductive layer in arc portions of the long hole at ends inside the effective region of the large-sized wiring board.

6. The method for manufacturing a wiring board according to claim 2, further comprising:
applying a finishing process to the wiring board comprising the effective region of the large-sized wiring board,
wherein the applying of the finishing process includes moving the rotary tool having the side blade from an inner side of the hole toward a segmented portion formed at the hole while rotating the rotary tool having the side blade such that a front portion of the rotary tool having the side blade in a direction of travel moves from an effective region side toward a dummy region side.

7. The method for manufacturing a wiring board according to claim 2, further comprising:

applying a finishing process to the wiring board comprising the effective region of the large-sized wiring board,
wherein the applying of the finishing process includes moving the rotary tool having the side blade from an outer side of the hole toward a segmented portion formed at the hole while rotating the rotary tool having the side blade such that a front portion of the rotary tool having the side blade in a direction of travel moves from a dummy region side toward an effective region side.

8. The method for manufacturing a wiring board according to claim 1, wherein the moving of the rotary tool having the tip blade includes positioning the rotary tool having the tip blade such that a center of the rotary tool having the tip blade is on a dummy region side of the border of the effective region and the dummy region.

9. The method for manufacturing a wiring board according to claim 8, wherein the moving of the rotary tool having the tip blade includes positioning the rotary tool having the tip blade such that a center of the rotary tool having the tip blade is on a dummy region side of the border of the effective region and the dummy region.

10. The method for manufacturing a wiring board according to claim 8, wherein the large-sized wiring board has an opening-edge conductive layer and an outer insulating layer such that the opening-edge conductive layer is extending sideway from the inner-hole conductive layer and covering an opening edge portion of the large-sized wiring board and that the outer insulating layer is covering an electrical circuit printed in the effective region of the large-sized wiring board and a tip portion of the opening-edge conductive layer on the large-sized wiring board.

11. The method for manufacturing a wiring board according to claim 3, wherein the penetrating hole is formed such that the penetrating hole is a long hole elongated along the border, and the large-sized wiring board has an opening-edge conductive layer and an outer insulating layer such that the opening-edge conductive layer is extending sideway from the inner-hole conductive layer and covering an opening edge portion of the large-sized wiring board and that the outer insulating layer is covering an electrical circuit printed in the effective region of the large-sized wiring board and from a tip portion to a base portion of the opening-edge conductive layer in arc portions of the long hole at ends inside the effective region of the large-sized wiring board.

12. The method for manufacturing a wiring board according to claim 8, further comprising:
applying a finishing process to the wiring board comprising the effective region of the large-sized wiring board,
wherein the applying of the finishing process includes moving the rotary tool having the side blade from an inner side of the hole toward a segmented portion formed at the hole while rotating the rotary tool having the side blade such that a front portion of the rotary tool having the side blade in a direction of travel moves from an effective region side toward a dummy region side.

13. The method for manufacturing a wiring board according to claim 8, further comprising:
applying a finishing process to the wiring board comprising the effective region of the large-sized wiring board,
wherein the applying of the finishing process includes moving the rotary tool having the side blade from an outer side of the hole toward a segmented portion formed at the hole while rotating the rotary tool having the side blade such that a front portion of the rotary tool having the side blade in a direction of travel moves from a dummy region side toward an effective region side.

14. The method for manufacturing a wiring board according to claim 1, wherein the large-sized wiring board has an opening-edge conductive layer and an outer insulating layer such that the opening-edge conductive layer is extending sideway from the inner-hole conductive layer and covering an opening edge portion of the large-sized wiring board and that the outer insulating layer is covering an electrical circuit printed in the effective region of the large-sized wiring board and a tip portion of the opening-edge conductive layer on the large-sized wiring board.

15. The method for manufacturing a wiring board according to claim 1, wherein the penetrating hole is formed such that the penetrating hole is a long hole elongated along the border, and the large-sized wiring board has an opening-edge conductive layer and an outer insulating layer such that the opening-edge conductive layer is extending sideway from the inner-hole conductive layer and covering an opening edge portion of the large-sized wiring board and that the outer insulating layer is covering an electrical circuit printed in the effective region of the large-sized wiring board and from a tip portion to a base portion of the opening-edge conductive layer in arc portions of the long hole at ends inside the effective region of the large-sized wiring board.

16. The method for manufacturing a wiring board according to claim 15, further comprising:
applying a finishing process to the wiring board comprising the effective region of the large-sized wiring board,
wherein the applying of the finishing process includes moving the rotary tool having the side blade from an inner side of the hole toward a segmented portion formed at the hole while rotating the rotary tool having the side blade such that a front portion of the rotary tool having the side blade in a direction of travel moves from an effective region side toward a dummy region side.

17. The method for manufacturing a wiring board according to claim 15, further comprising:
applying a finishing process to the wiring board comprising the effective region of the large-sized wiring board,
wherein the applying of the finishing process includes moving the rotary tool having the side blade from an outer side of the hole toward a segmented portion formed at the hole while rotating the rotary tool having the side blade such that a front portion of the rotary tool having the side blade in a direction of travel moves from a dummy region side toward an effective region side.

18. The method for manufacturing a wiring board according to claim 1, further comprising:
applying a finishing process to the wiring board comprising the effective region of the large-sized wiring board,
wherein the applying of the finishing process includes moving the rotary tool having the side blade from an outer side of the hole toward a segmented portion formed at the hole while rotating the rotary tool having the side blade such that a front portion of the rotary tool having the side blade in a direction of travel moves from a dummy region side toward an effective region side.

19. A method for manufacturing a wiring board according to claim 5, further comprising:
applying a finishing process to the wiring board comprising the effective region of the large-sized wiring board, wherein the applying of the finishing process includes moving the rotary tool having the side blade from an inner side of the hole toward a segmented portion formed at the hole while rotating the rotary tool having the side blade such that a front portion of the rotary tool having the side blade in a direction of travel moves from an effective region side toward a dummy region side.

* * * * *